United States Patent [19]
Rolandi

[11] Patent Number: 6,147,902
[45] Date of Patent: Nov. 14, 2000

[54] HIGH STORAGE CAPACITY NON-VOLATILE MEMORY

[75] Inventor: Paolo Rolandi, Voghera, Italy

[73] Assignee: STMicroelectronics S.r.l., Agrate Brianza, Italy

[21] Appl. No.: 09/320,315

[22] Filed: May 26, 1999

[30] Foreign Application Priority Data

May 27, 1998 [EP] European Pat. Off. .............. 98830324

[51] Int. Cl.[7] .................................................. G11C 16/04
[52] U.S. Cl. ............................... 365/185.03; 365/185.11; 365/230.03; 365/230.06
[58] Field of Search ........................ 365/230.06, 230.01, 365/230.03, 185.01, 185.03, 185.17, 185.11

[56] References Cited

U.S. PATENT DOCUMENTS

| | | | |
|---|---|---|---|
| 5,541,886 | 7/1996 | Hasbun .............................. | 365/230.01 |
| 5,596,526 | 1/1997 | Assar et al. ......................... | 365/185.17 |
| 5,717,632 | 2/1998 | Richart et al. ....................... | 365/185.2 |
| 5,754,469 | 5/1998 | Hung et al. ......................... | 365/185.03 |
| 5,844,841 | 12/1998 | Takeuchi et al. ................... | 365/185.03 |
| 5,905,673 | 5/1999 | Khan ................................. | 365/185.03 |

FOREIGN PATENT DOCUMENTS

| | | |
|---|---|---|
| 0 724 266 A1 | 7/1996 | European Pat. Off. . |
| 0 766 254 A2 | 4/1997 | European Pat. Off. . |
| WO 95/34074 | 12/1995 | WIPO . |

*Primary Examiner*—Viet Q. Nguyen
*Attorney, Agent, or Firm*—Theodore E. Galanthay; Robert Iannucci; Seed IP Law Group PLLC

[57] ABSTRACT

A memory device has an array of memory cells, including at least one memory block including multiple-level memory cells adapted for storing each one $N \geq 2$ bits of information. The at least one memory block also includes electrically erasable and programmable bilevel memory cells, each for storing one bit of information. A circuit is provided for either accessing and reading one of said multiple-level memory cell or simultaneously accessing and reading N of said electrically erasable and programmable bilevel memory cells, depending on address signals supplied to the memory device.

13 Claims, 6 Drawing Sheets

HIGH STORAGE CAPACITY NON-VOLATILE MEMORY

TECHNICAL FIELD

The present invention relates to non-volatile memories. More particularly, the invention concerns a high storage capacity non-volatile memory.

BACKGROUND OF THE INVENTION

The market demand for non-volatile semiconductor memory devices with higher and higher storage capacity is known. The manufacturers are therefore constantly coping with the task of finding solutions suitable for achieving the desired storage capacity at the same time keeping the production costs reasonable.

A promising technique provides for storing in each single non-volatile memory cell more than just one bit of information. This technique is also known as multiple-level programming and sensing. While in conventional, bilevel non-volatile memory devices each memory cell can take only two distinct programming states, i.e., written and erased, in multiple-level devices each memory cell can take more than two programming states, for example four, corresponding to two bits of information.

High capacity multiple-level Flash EEPROM memories have been presented by some manufacturers. However, such devices exhibit significant reliability problems. Multiple-level programming and sensing requires that the different programming levels of the memory cells be more precisely set than in the bilevel programming and sensing case, with a degree of precision increasing with the number of programming levels to be programmed and detected. Flash EEPROM devices are characterized by the feature of electrical erasing, and as a consequence the features of the memory cells vary during the life of the device.

SUMMARY OF THE INVENTION

In view of the above, and according to an embodiment of the invention, a memory device is provided comprising an array of memory cells, including at least one memory block, with the memory block comprising multiple-level memory cells adapted for storing each one $N \geq 2$ bits of information. The memory block also includes electrically erasable and programmable bilevel memory cells each one adapted for storing one bit of information. Means are also provided for either accessing and reading one of said multiple-level memory cell or simultaneously accessing and reading N of said electrically erasable and programmable bilevel memory cells, depending on address signals supplied to the memory device.

Thanks to embodiments of the present invention, a memory device is provided which has a high storage capacity, assured by the multiple-level memory cells, and at the same time can be electrically erased and programmed, although only in part. This situation is the most common one in several practical applications, where there is a large part of, e.g., a microprocessor program code that need not be changed, and only a smaller part of the code may be subject to changes. Thus, the large part of the code can be stored in the multiple-level memory cells, with a significant gain in chip area, and only the smaller, variable part of the code is stored in the bilevel electrically erasable and programmable cells. The latter, being conventional bilevel cells, are not affected by the problems previously outlined exhibited by multiple-level electrically erasable and programmable cells.

BRIEF DESCRIPTION OF THE DRAWINGS

The features of the present invention will be made apparent by the following detailed description of two particular embodiments thereof, illustrated by way of example in the annexed drawings.

DETAILED DESCRIPTION OF THE INVENTION

Figure 1:
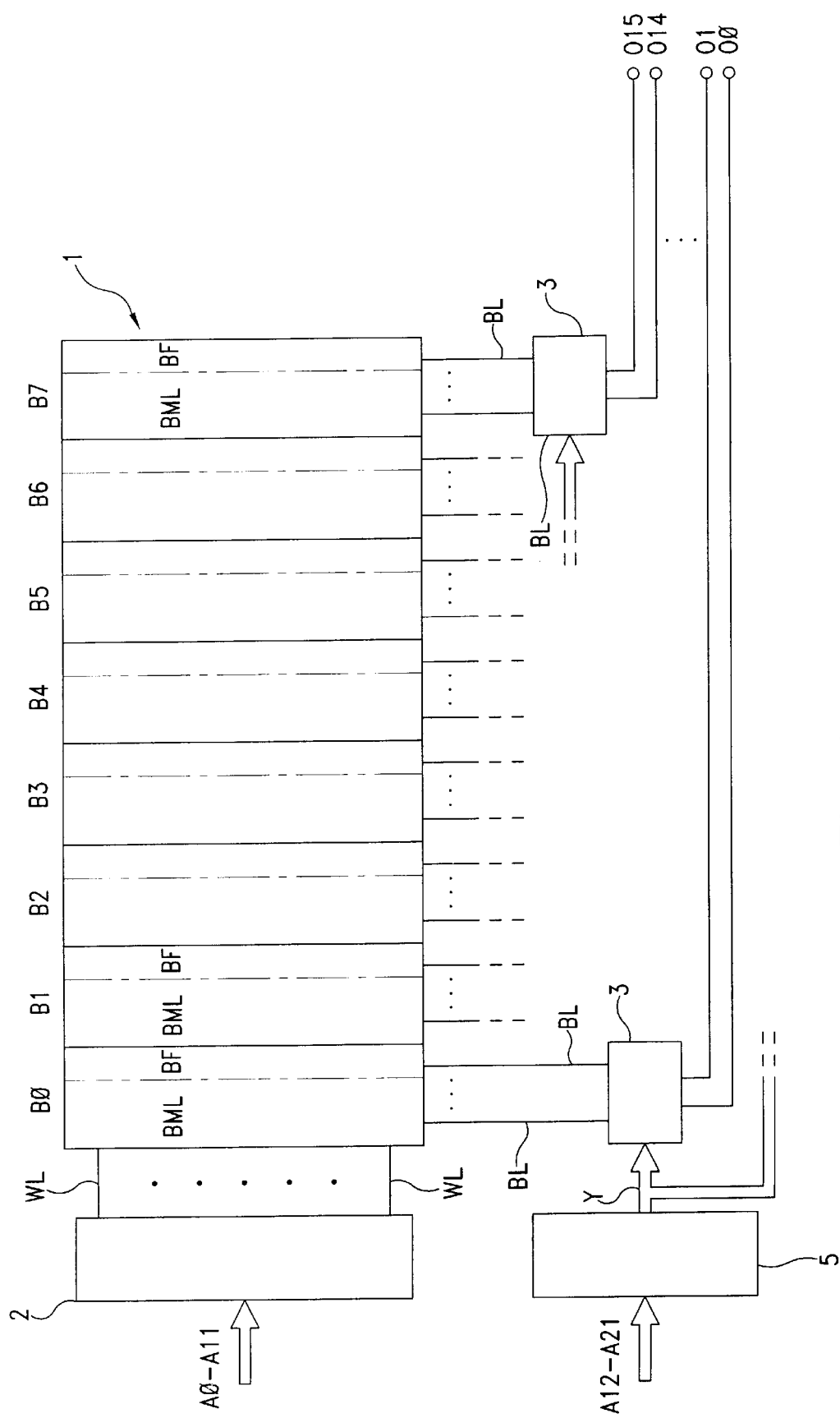
FIG. 1 is a schematic block diagram of a memory device according to the present invention.

FIG. 1 shows a schematic block diagram of a memory device according to the present invention. The memory device comprises a matrix of memory cells 1. Conventionally, the memory matrix 1 is a bidimensional array of memory cells (the latter are not shown, since they are conventional), that are arranged at the intersection of rows (word lines) WL and columns (bit lines) BL.

The memory matrix includes eight memory blocks B0–B7. Each memory block B0–B7 is associated to two respective data output lines (O0,O1), (O2,O3) . . . (O14, O15) of the memory device.

A row address decoding circuit 2 receives a subset A0–A11 (row address signals) of a set A0–A21 of address signals. The row address decoding circuit 2 decodes the digital code carried by the row address signals A0–A11 and consequently activates one out of 4096 word lines WL. The detailed structure of the row address decoding circuit 2 will not be described, being considered well known to the skilled technicians.

The memory device also conventionally comprises a column address decoding circuit 5 receiving a subset A12–A21 (column address signals) of the set of address signals A0–A21. The column address decoding circuit 5 decodes the digital code carried by the column address signals A12–A21, and generates column selection signals Y. The detailed structure of the column address decoding circuit 5 will not be described in detail, being considered well known to those skilled in the art.

To each memory block B0–B7 there is associated a column selection and sensing circuitry 3. Each column selection and sensing circuitry 3 receives the column selection signals Y and accordingly selects a specific column or (as explained later) columns BL among those of the respective memory block B0–B7. Block 3 also performs a sensing of the addressed memory cells, i.e., those located at the intersection of the selected row and the selected columns, and controls the logic state of the two respective data output lines (O0,O1) . . . (O14,O15).

Figure 2:
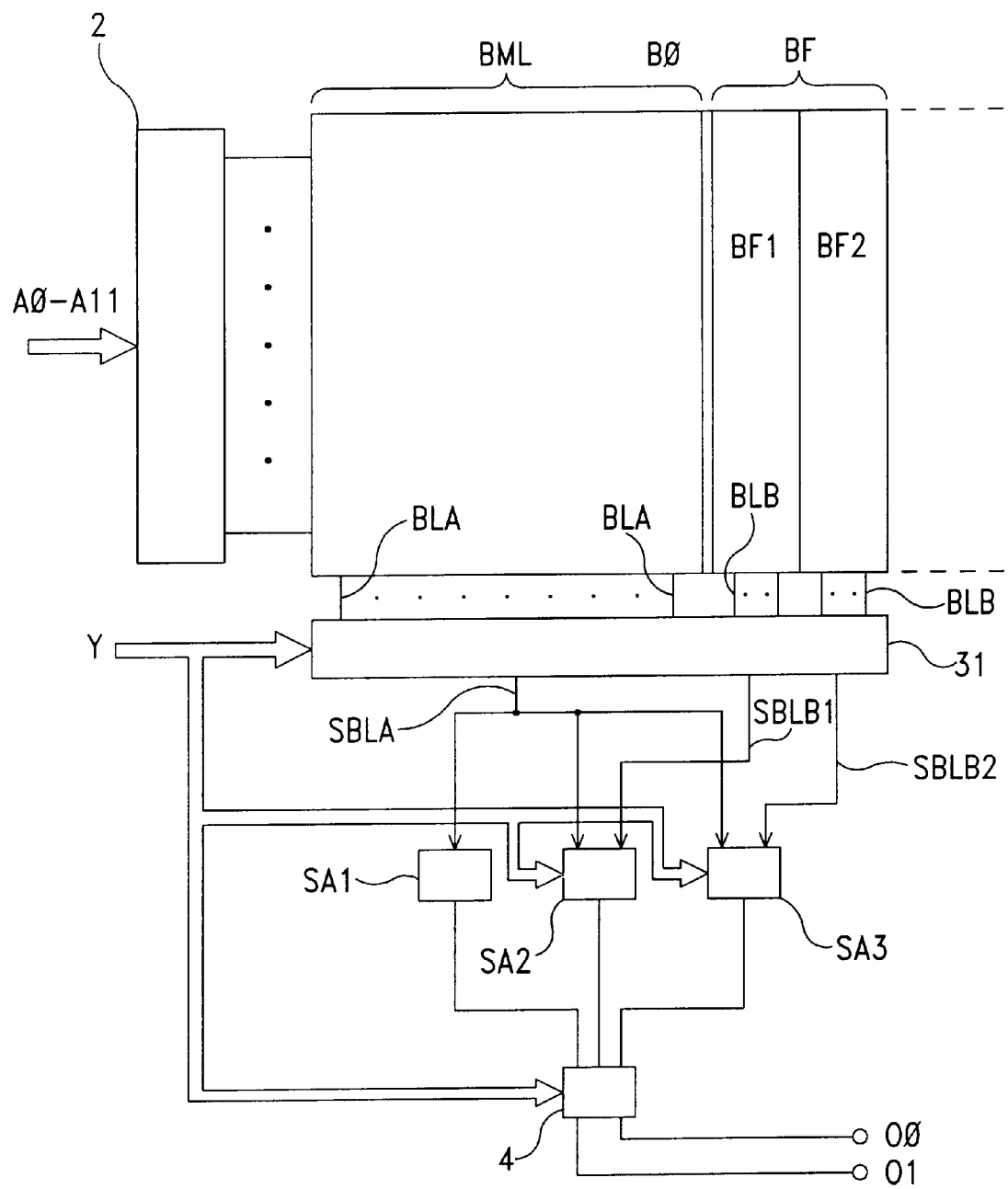
FIG. 2 is a more detailed view of a memory block of the device shown in FIG. 1, in a first embodiment of the invention.

As shown in greater detail in FIG. 2, referring to a first embodiment of the present invention, each memory block B0–B7 comprises two memory sub-blocks BML and BF, each including a respective number of memory cells.

Memory sub-block BML comprises multiple-level non-volatile memory cells, e.g., ROM cells or electrically programmable memory cells such as EPROM cells, fabricated by means of any one of the reliable, conventional processes already known and industrially used for the production of multiple-level non-volatile memories. Memory sub-block BF comprises conventional, bilevel electrically erasable and programmable Flash memory cells, fabricated by means of any one of the reliable, conventional processes already known and industrially used for the production of Flash EEPROM memories.

Memory sub-block BML is not electrically erasable, and has a significantly higher storage capacity than memory sub-block BF, including electrically erasable cells. Memory sub-block BML includes for example 1008 columns BLA of multiple-level memory cells, e.g., four-level memory cells. Memory sub-block BF includes for example two groups BF1, BF2 each of sixteen columns BLB of conventional, bilevel Flash EEPROM cells.

Columns BLA and BLB are fed to a column selection circuit 31, the structure of which will be described in detail later in connection with FIG. 3. The column selection circuit 31 receives the column selection signals Y. Column selection circuit 31 selects one out of the 1008 columns BLA (the selected column of sub-block BML being connected to a first output line SBLA of circuit 31), or one column out of the sixteen columns BLB of each group BF1, BF2 of the Flash sub-block BF (the two selected columns of sub-block BF being connected to two further output lines SBLB1, SBLB2 of circuit 31).

The output line SBLA of circuit 31 is supplied in parallel to three sense amplifiers SA1, SA2, SA3. The other two output lines SBLB1 (selected bit line of group BF1) and SBLB2 (selected bit line of group BF2) are respectively supplied to sense amplifiers SA2 and SA3.

The outputs SO1, SO2, SO3 of sense amplifiers SA1, SA2, SA3 are supplied to an encoder circuit 4 controlling the logic state of the respective two output lines O0, O1.

Figure 3:
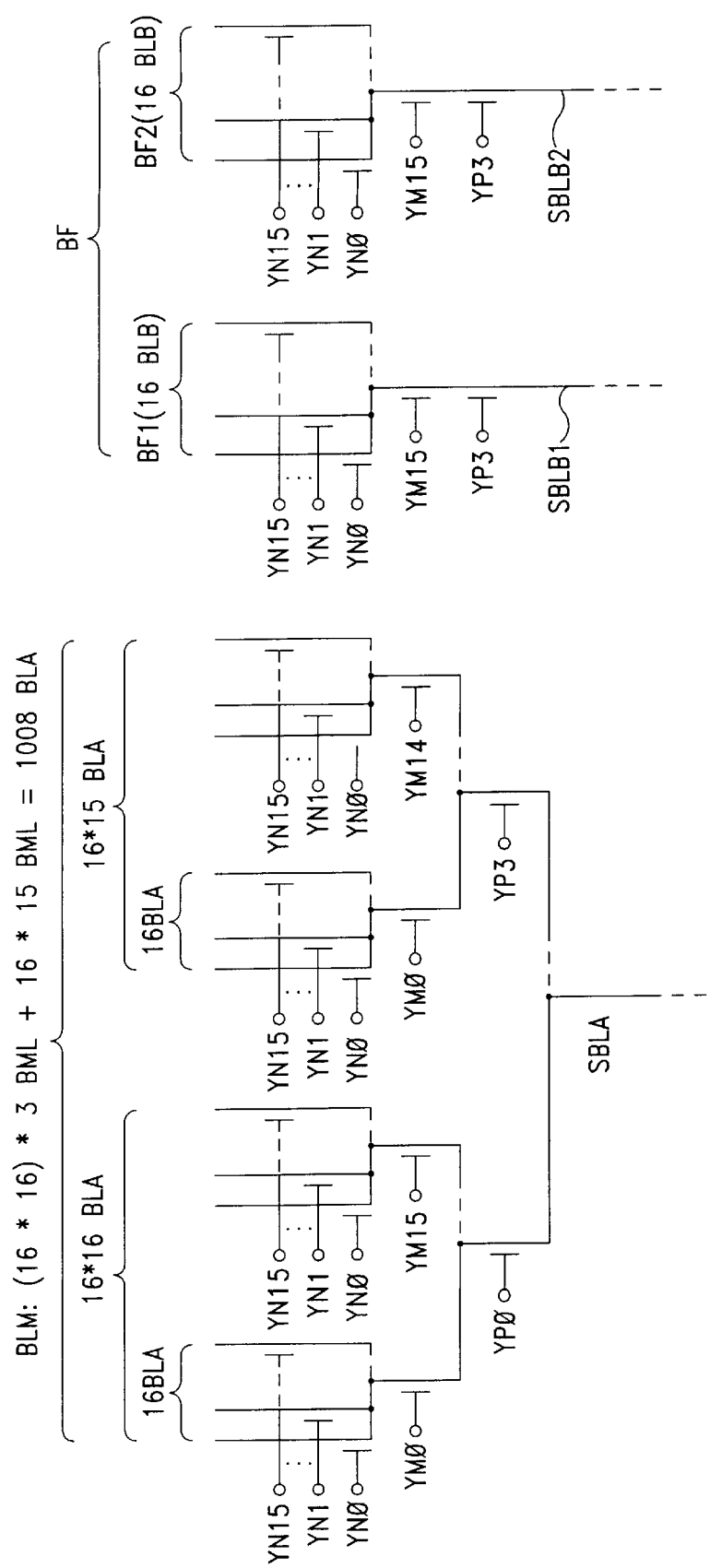
FIG. 3 is a circuit diagram of a column selection arrangement for the memory block of FIG. 2.

FIG. 3 shows in detail the structure of the column selection circuit 31 shown in FIG. 2. First of all, it is to be noted that column selection scheme provides for three levels of selection. Signals YN0–YN15, YM0–YM15 and YP0–YP3, all belonging to the column selection signals Y, respectively perform a first, a second and a third level of selection.

The multiple-level cell block BLM comprises in this example 1008 columns BLA. These columns are grouped in packets of sixteen columns each; selection of one column BLA inside each of said packets is made by means of signals YN0–YN15. Three groups of sixteen column packets and one group of fifteen column packets are provided, for a total of 1008 columns BLA. Signals YM0–YM15 allow to select one column packet among the sixteen packets of each one of the first three groups; signals YM0–YM14 allow to select one column packet among the fifteen packets of the last group. Signals YP0–YP3 allow to select one among the groups of column packets.

Similarly, signals YN0–YN15, in combination with signals YM15 and YP3, allow to select one out of the sixteen columns BLB of each group of sixteen columns BF1, BF2 of the Flash sub-block BF.

Clearly, for each digital code carried by the column address signals A12–A21, only one of signals YN0–YN15, only one of signals YM0–YM15, and only one of signals YP0–YP3 is activated.

Figure 4:
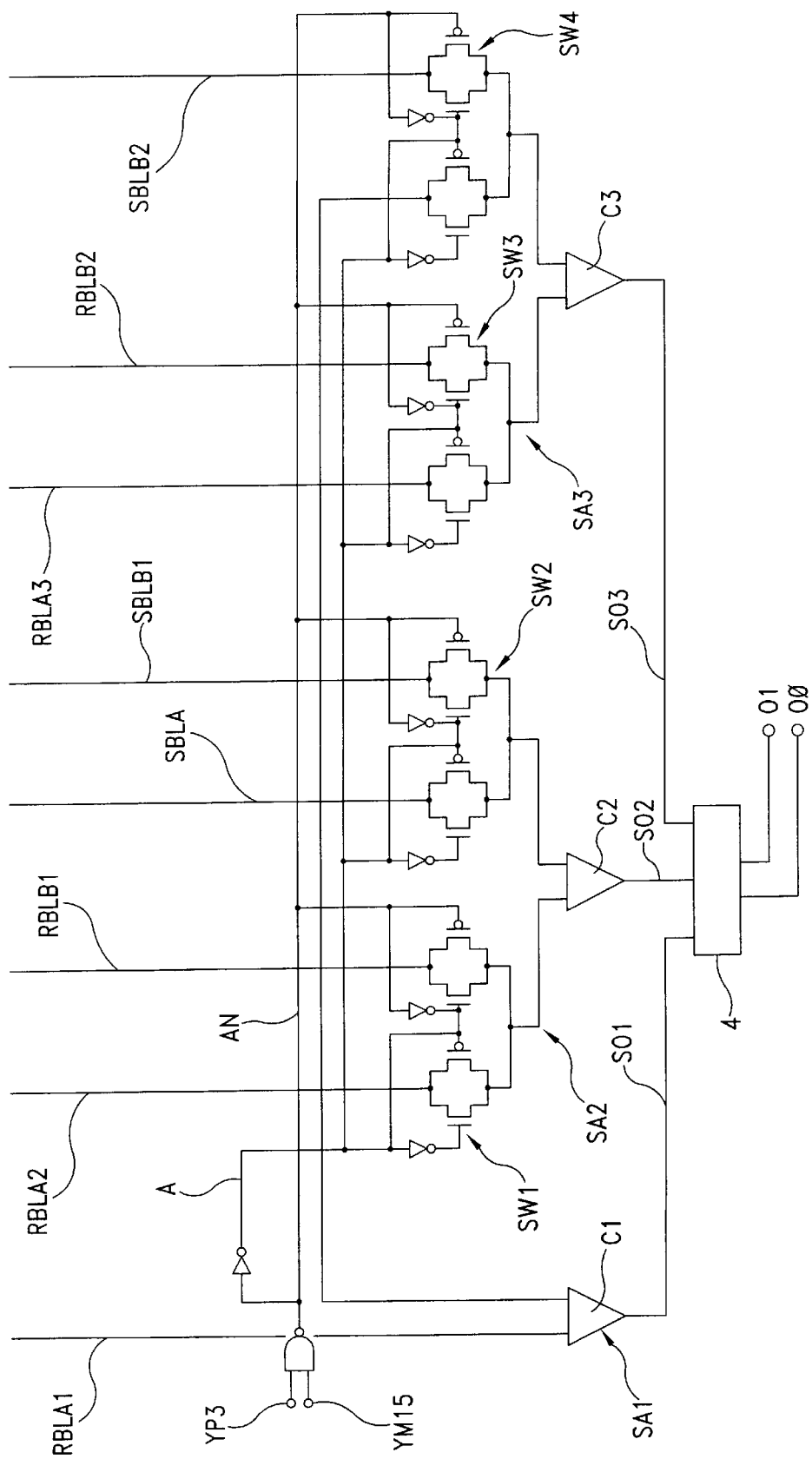
FIG. 4 is a circuit diagram of a sensing arrangement for the memory block of FIG. 2.

FIG. 4 shows in greater detail the structure of the sense amplifiers SA1, SA2, SA3. The first sense amplifier SA1 comprises a comparator C1 which is supplied directly by the selected column SBLA of sub-block BML and, conventionally, by a first reference column RBLA1 of multiple-level reference memory cells provided inside sub-block BML. The second sense amplifier SA2 comprises a comparator C2 and two switches SW1, SW2. Switch SW1 allows to supply one input of comparator C2 with either a second reference column RBLA2 of sub-block BML, or a first reference column RBLB1 of reference Flash EEPROM memory cells associated with group BF1 in sub-block BF. Switch SW2 allows to supply the other input of comparator C2 with either the selected column SBLA of sub-block BML, or the selected column SBLB1 of group BF1 in sub-block BF. The third sense amplifier SA3 comprises a comparator C3 and two switches SW3, SW4. Switch SW3 allows to supply one input of comparator C3 with either a third reference column RBLA3 of sub-block BML, or a reference column RBLB2 associated to group BF2 of sub-block BF. Switch SW4 allows to supply the other input of comparator C3 with either the selected column SBLA of sub-block BML, or the selected column SBLB2 of group BF2 in sub-block BF. Switches SW1, SW2, SW3 and SW4 are each composed of two CMOS pass gates (i.e., an N-channel MOSFET and a P-channel MOSFET connected in parallel to each other, controlled by complementary signals). The first pass gate of each one of the switches is controlled by a signal A which is activated when both signals YM15 and YP3 are activated; the second pass gate of each switch is controlled by a signal AN being the logic complement of signal A. Thus, while comparator C1 is always supplied with the selected column SBLA within block BML, and with the corresponding reference column RBLA1, comparators C2 and C3 are either supplied with column SBLA and reference columns RBLA2, RBLA3 when either one of signals YM15 or YP3 is deactivated, or they are supplied with columns SBLB1, RBLB1 and SBLB2, RBLB2, respectively, when signals YM15 and YP3 are both activated. Reference columns RBLA1, RBLA2, RBLA3 are columns of multiple-level reference memory cells programmed at different programming levels, so that the threshold of comparators C1, C2 and C3 is different.

Figure 5:
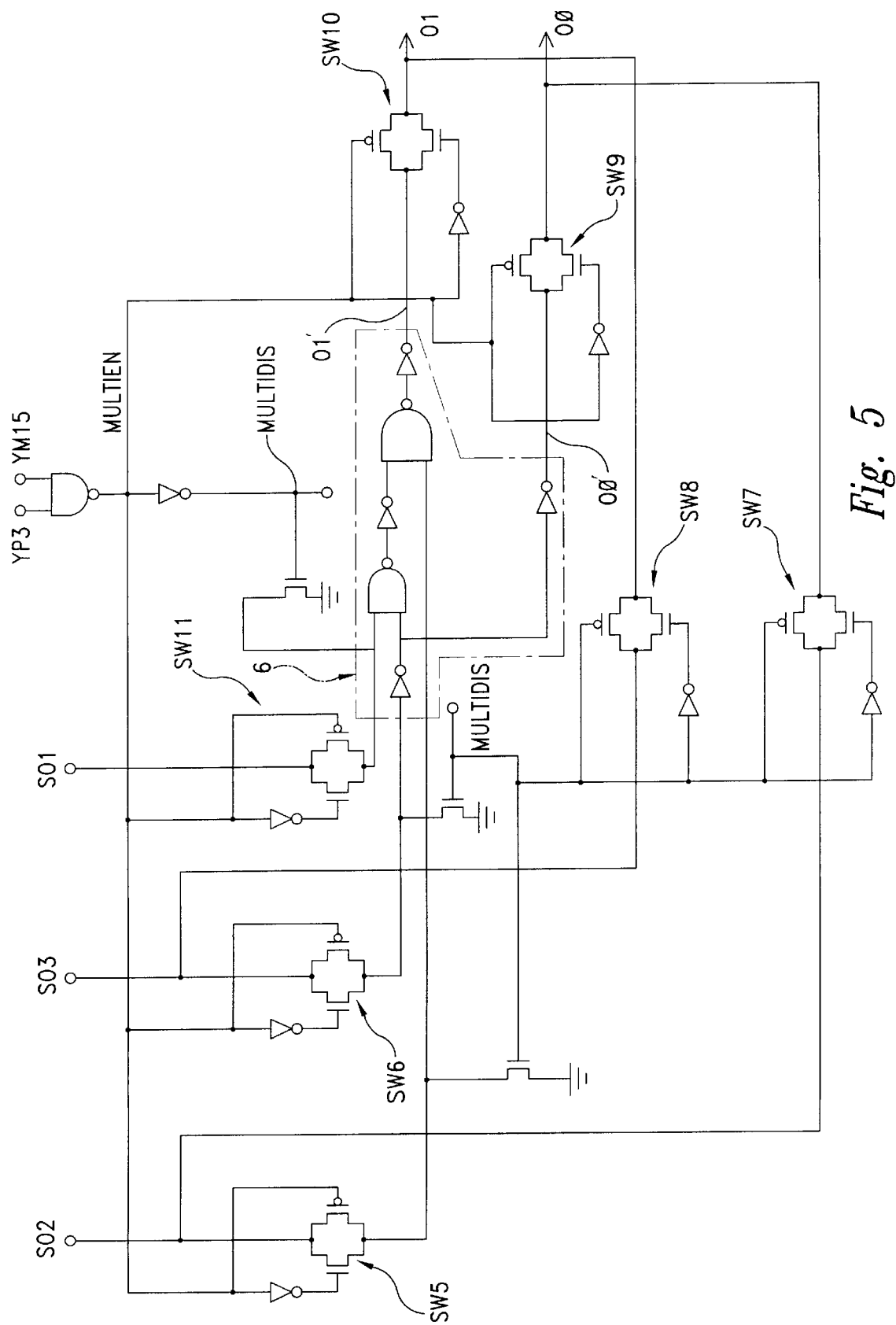
FIG. 5 is a circuit diagram of an encoding circuit incorporated in the sensing arrangement shown in FIG. 4.

In FIG. 5 there is shown a detailed circuit diagram of the encoder block 4. The encoder 4 comprises an encoding circuit 6. Outputs SO2 and SO3 of sense amplifiers SA2 and SA3 are supplied to the encoding circuit 6 through respective first switches SW5 and SW6 and, through respective switches SW7 and SW8, are directly supplied to the respective output lines O0 and O1. All the switches comprise a CMOS pass gate. Switches SW5 and SW6 are controlled by a signal MULTIEN which is activated (high logic level) when either one or both of signals YP3 and YM15 is deactivated, i.e., when the multiple-level cell block BML is accessed. Switches SW7 and SW8 are controlled by a signal MULTIDIS which is activated (high logic level) when both YP3 and YM15 are activated, i.e., when the Flash cell block B1 is accessed.

Output SO1 of sense amplifier SA1 is supplied to the decoding circuit 6 through a switch SW11.

The encoding circuit 6 has two outputs O0' and O1'; substantially circuit 6 performs the following logic operation:

O0'=SO3

O1'=(SO1 AND NOT(SO3)) AND SO2.

The outputs O0' and O1' of circuit 6 are connected to the output lines O0, O1 through respective switches SW9, SW10, again formed by a CMOS pass gate, controlled by signal MULTIEN. In this way, the outputs O0', O1' of circuit 6 are connected to the output lines O0, O1 when the multiple-level cells block BML is accessed, while they are disconnected from the output lines O0, O1 when the Flash cell block BF is accessed; in the latter case, outputs SO2 and SO3 are directly supplied to the output lines O0, O1.

Figure 6:
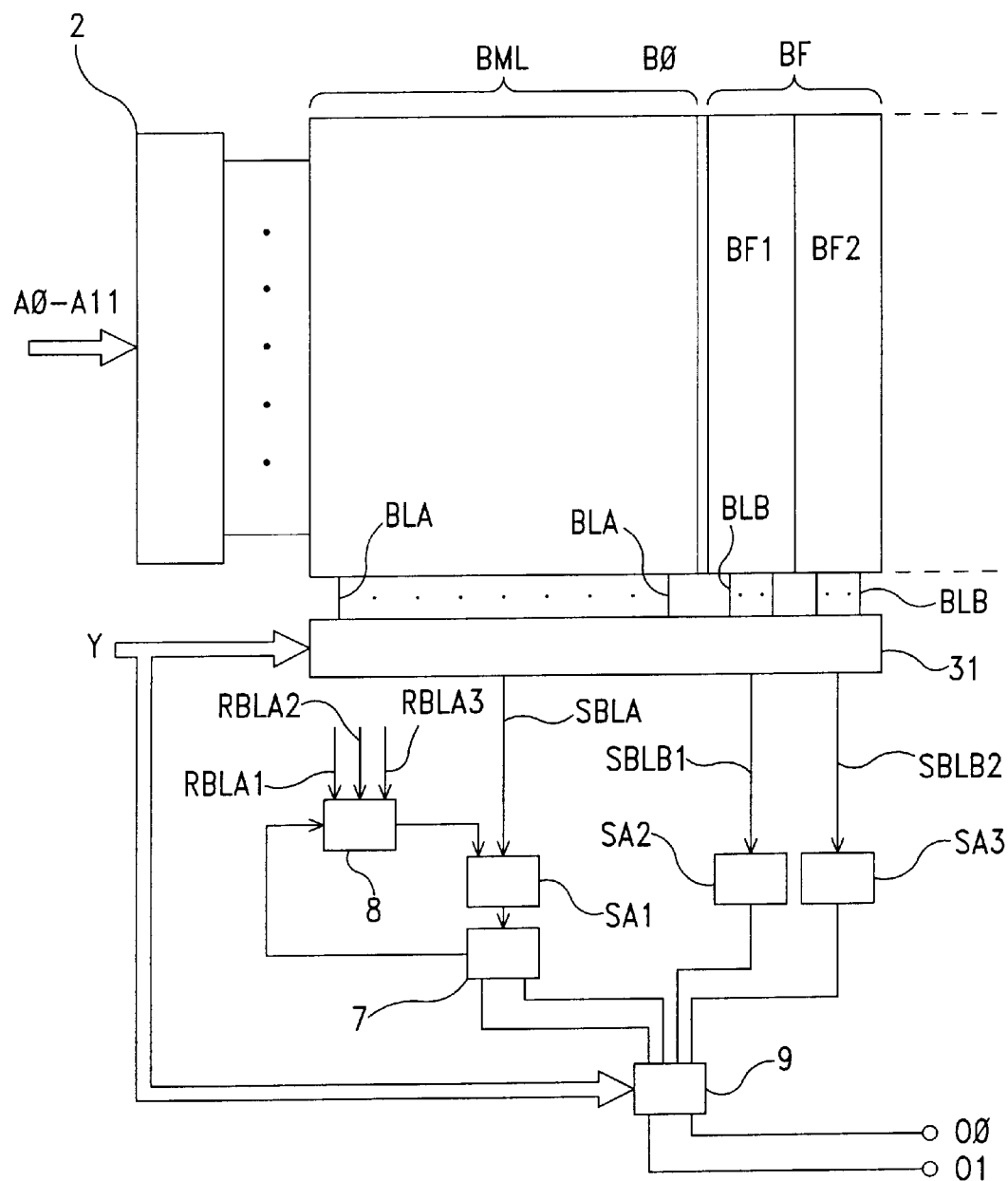
FIG. 6 is a detailed view of a memory block of the device shown in FIG. 1, in a second embodiment of the present invention.

In FIG. 6 there is shown as in FIG. 2 a more detailed structure of a memory block, in a second embodiment of the invention. In the first embodiment, a parallel sensing scheme for sensing the multiple-level memory cells was provided. In this embodiment instead, a serial sensing scheme is depicted. One of such sensing scheme, called "serial-dichotomic", is described in the European Patent Application No. EP-A-0724266, the relevant disclosure of which is herein incorporated by reference. For this reason, only a brief, schematic description is given in the following.

Again, three sense amplifiers SA1, SA2 and SA3 are provided for. However, sensing of the selected multiple-level cells column SLBA is performed by using only one sense amplifier, namely SA1. A state machine 7 is supplied with the output of sense amplifier SA1. State machine 7 controls a reference column selection circuit 8 which, depending on the result of the sensing performed by sense amplifier SA1, selects which one of the three reference columns RBLA1, RBLA2, RBLA3 is to be supplied to sense amplifier SA1.

Sense amplifiers SA2 and SA3 are used to sense in parallel the selected Flash memory cells of columns SBLB1 and SBLB2.

State machine 7 already provides at its outputs a two-bit code carrying the result of the sensing. The two-bit code generated by the state machine 7 is supplied, together with the outputs of sense amplifiers SA2 and SA3, to a logic circuit 9, substantially a switch, allowing for transferring to the output lines O0, O1 either the outputs of state machine 7, or the outputs of sense amplifiers SA2, SA3.

Other sensing schemes are possible, for example mixed parallel-serial schemes.

In the present description reference has been made to the case of four-level memory cells, each capable of storing two bits of information. In this case, either one four-level cell is addressed, or two bilevel cells are simultaneously addressed.

It is straightforward to generalize the description to cells capable of storing more than two bits of information. Supposing the multiple-level cells store N bits of information each, then either one multiple-level cell is addressed, or N bilevel cells are simultaneously addressed. In the case a parallel sensing approach is used, then $2^N-1$ sense amplifiers have to be provided, of which $(2^N-1)-N$ are supplied uniquely by the selected column of multiple-level cells, while the remaining N sense amplifiers are each one supplied with either the selected column of multiple-level memory cells or with a respective column of bilevel cells. If instead a serial sensing approach is used, then a serial sensing circuit plus N sense amplifiers supplied with respective columns of bilevel cells are necessary. Again, mixed parallel-serial sensing schemes are possible.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device having an array of memory cells, comprising:

at least one memory block, including multiple-level memory cells each adapted for storing $N \geq 2$ bits of information;

electrically erasable and programmable bilevel memory cells each one adapted for storing one bit of information;

means for either accessing and reading one of said multiple-level memory cell or simultaneously accessing and reading N of said electrically erasable and programmable bilevel memory cells, depending on address signals (A0A21) supplied to the memory device, wherein said at least one memory block comprises a first sub-block including a first number of columns of multiple-level memory cells, a second sub-block including N groups (each made up of a second number of columns of bilevel electrically erasable and programmable memory cells, and wherein said means comprises first column selection means for selecting one column out of said first number of columns of the first sub-block, and second column selection means for simultaneously selecting one column out of said second number of columns of each of said N groups, the selection of either said one column of multiple-level cells or said N columns of bilevel electrically erasable and programmable cells being mutually exclusive and depending on the address signals.

2. The memory device according to claim 1 wherein said means comprises sensing means supplied with either said selected column of multiple-level memory cells or said N selected columns of bilevel electrically erasable and programmable memory cells, said sensing means generating an N-bit output code.

3. The memory device according to claim 2 wherein said sensing means comprises a parallel sensing circuit formed by $2^N-1$ sense amplifiers, $(2^N-1)-N$ sense amplifiers supplied with said selected column of multiple-level memory cells, the remaining N sense amplifiers each one supplied with either the selected column of multiple-level memory cells or a respective one of said N selected columns of bilevel electrically erasable and programmable memory cells, the sensing means further comprising an encoding circuit supplied with outputs of said $2^N-1$ sense amplifiers and generating said N-bit output code.

4. The memory device according to claim 2 wherein said sensing means comprises a serial sensing circuit supplied with said selected column of multiple-level memory cells for performing a serial sensing of the multiple-level memory cells, and N sense amplifiers each one supplied with a respective one of said N selected columns of bilevel electrically erasable and programmable memory cells.

5. The memory device according to claim 1 wherein said multiple-level memory cells form a larger part of said memory block.

6. The memory device according to claim 1, further comprising more than one identical memory blocks.

7. A memory device comprising:

a block of a plurality of multiple-level memory cells;

a block of a plurality of bi-level electrically erasable memory cells; and a sensing circuit for reading one of the multiple-level memory cells, or for reading one or more of the electronically erasable memory cells, depending on address signals received at the sensing circuit, wherein the block of multiple-level memory cells comprises a first subblock including a number of columns and wherein the block of bi-level electrically erasable memory cells comprises a second subblock including N groups each made up of a second number of columns; and wherein the sensing circuit comprises:

a first column selection circuit for selecting one column from the first subblock;

a second column selection circuit for simultaneously selecting one column out of each of the N groups; and an address decoder adapted to receive the address signals and structured to enable either the first column selection circuit the second column selection circuit responsive to the address signals.

8. The memory device of claim 7 wherein the sensing circuit receives either the selected column of the fist subblock, or receives the selected N columns out of the second block, and wherein the sensing circuit generates an N-bit output code.

9. The memory device of claim 8 wherein the sensing circuit comprises a parallel sensing circuit formed by $2^N-1$ sense amplifiers, wherein $((2^N-1)-N)$ of the sense amplifiers are structured to receive signals from the first subblock, and the remaining N sense amplifiers are structured to receive signals from either a selected column of memory cells of the first subblock or receive signals from respective of the N selected columns of the second subblock.

10. The memory device of claim 9 wherein the sensing circuit further comprises an encoding circuit structured to receive outputs from the $2^N-1$ sense amplifiers and structured to generate the N-bit output code.

11. The memory device of claim 8 wherein the sensing circuit comprises a serial sensing circuit structured to receive signals from the selected column of cells of the first subblock and perform a serial sensing of the received signals.

12. The memory device of claim 11 wherein the sensing circuit further comprises N sense amplifiers each supplied with a respective one of the N selected columns.

13. The memory device of claim 7 wherein the block of a plurality of multiple-level memory cells is larger than the block of a plurality of bi-level electronically erasable memory cells.

* * * * *